(12) United States Patent
Lyalin et al.

(10) Patent No.: US 10,110,184 B2
(45) Date of Patent: Oct. 23, 2018

(54) POWER AMPLIFICATION SYSTEM WITH REACTANCE COMPENSATION

(71) Applicant: SKYWORKS SOLUTIONS, INC., Woburn, MA (US)

(72) Inventors: Aleksey A. Lyalin, Moorpark, CA (US); Taesong Hwang, Thousand Oaks, CA (US); Russ Alan Reisner, Oxnard, CA (US); Nicholas Quinn Muhlmeyer, North Hills, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/487,384

(22) Filed: Apr. 13, 2017

(65) Prior Publication Data

US 2017/0338781 A1    Nov. 23, 2017

Related U.S. Application Data

(60) Provisional application No. 62/321,970, filed on Apr. 13, 2016.

(51) Int. Cl.
| | |
|---|---|
| *H03F 3/30* | (2006.01) |
| *H03F 3/26* | (2006.01) |
| *H03F 1/07* | (2006.01) |
| *H03F 3/193* | (2006.01) |
| *H03F 3/66* | (2006.01) |
| *H03G 11/00* | (2006.01) |

(52) U.S. Cl.
CPC ............. *H03F 3/3098* (2013.01); *H03F 1/07* (2013.01); *H03F 3/1935* (2013.01); *H03F 3/26* (2013.01); *H03F 3/66* (2013.01); *H03G 11/004* (2013.01)

(58) Field of Classification Search
USPC .................. 330/252–261, 301–302, 305
See application file for complete search history.

(56) References Cited

U.S. PATENT DOCUMENTS 8,723,601 B2 *  5/2014  Cercelaru ........... H03F 3/45076
                                                    330/253

* cited by examiner

*Primary Examiner* — Hieu Nguyen
(74) *Attorney, Agent, or Firm* — Chang & Hale LLP

(57) ABSTRACT

Power amplification system is disclosed. A power amplification system can include a Class-E push-pull amplifier including a transformer balun. The power amplification can further include a reactance compensation circuit coupled to the transformer balun. In some embodiments, the reactance compensation circuit is configured to reduce variation over frequency of a fundamental load impedance of the power amplification system.

20 Claims, 8 Drawing Sheets

POWER AMPLIFICATION SYSTEM WITH REACTANCE COMPENSATION

CROSS-REFERENCE TO RELATED APPLICATION(S)

This application claims priority to U.S. Provisional Application No. 62/321,970 filed Apr. 13, 2016, entitled POWER AMPLIFICATION SYSTEM WITH REACTANCE COMPENSATION, the disclosure of which is hereby expressly incorporated by reference herein in its entirety.

BACKGROUND

Field

The present disclosure generally relates to power amplifiers.

Description of the Related Art

A power amplification system can be a push-pull amplifier used for envelope tracking. While a push-pull amplifier can be implemented for these applications, a need exists for a better design to improve rejection of second harmonics, lower power supply rail capacitance, and improve efficiency at high peaks. Additionally, 2G backwards compatibility is desirable, for a complete solution in a single circuit implementation.

SUMMARY

In accordance with some implementations, the present disclosure relates to a power amplification system. The power amplification system includes a Class-E push-pull amplifier including a transformer balun. The power amplification system also includes a reactance compensation circuit coupled to the transformer balun, the reactance compensation circuit being configured to reduce variation over frequency of a fundamental load impedance of the power amplification system.

In some embodiments, the reactance compensation circuit includes a first capacitor coupled between the transformer balun and an output of the power amplification system. In some embodiments, the reactance compensation circuit includes a second capacitor coupled between the transformer balun and a ground voltage.

In some embodiments, a leakage inductance of the transformer balun in series with a capacitance of the reactance compensation circuit forms a series resonant circuit having a reactance that increases with frequency.

In some embodiments, the reactance compensation circuit includes a DC blocking capacitance selected to reduce variation over frequency of the fundamental load impedance.

In some embodiments, the transformer balun has a coupling coefficient selected to reduce variation over frequency of the fundamental load impedance. In some embodiments, the coupling coefficient is approximately −0.4.

In some embodiments, the transformer balun includes a first coil and a second coil, the first coil having a first tap coupled to a first differential path of the Class-E push-pull amplifier, a second tap coupled to a second differential path of the Class-E push-pull amplifier, and a third tap coupled to a supply voltage, the second coil having a fourth tap coupled, via the reactance compensation circuit, to a first output of the power amplification system and a fifth tap coupled, via the reactance compensation circuit, to a ground voltage.

In some embodiments, the second coil further has a sixth tap coupled, via the reactance compensation circuit, to a second output of the reactance compensation circuit. In some embodiments, the first output is a 2G output and the second output is a 3G output.

In some embodiments, the power amplification system further comprises a switch configured to couple either of the first output or the second output to the reactance compensation circuit.

In some embodiments, the Class-E push-pull amplifier includes a driver transistor coupled between an input of the power amplification system and a divider, a first differential transistor disposed between a first output of the divider and the transformer balun, and a second differential transistor disposed between a second output of the divider and the transformer balun.

In some embodiments, the power amplification system further comprises one or more bias circuits configured to bias at least one of the driver transistor, the first differential transistor, or the second differential transistor.

In some embodiments, the divider includes a transformer. In some embodiments, the power amplification system further comprises a second-harmonic trap disposed between a first end and a second end of a first coil of the transformer.

In some implementations, the present disclosure relates to a radio-frequency (RF) module including a packaging substrate configured to receive a plurality of components. In some embodiments, the radio-frequency module includes a power amplification system implemented on the packaging substrate, the power amplification system including a Class-E push-pull amplifier including a transformer balun, the power amplification system further including a reactance compensation circuit coupled to the transformer balun, the reactance compensation circuit being configured to reduce variation over frequency of a load impedance of the power amplification system.

In some embodiments, the radio-frequency module is a front-end module (FEM).

In some embodiments, the reactance compensation circuit of the RF module includes a capacitor coupled between the transformer balun and an output of the power amplification system.

In some implementations, the present disclosure relates to a wireless device including a transceiver configured to generate an input radio-frequency (RF) signal. In some embodiments, the wireless device includes a front-end module (FEM) in communication with the transceiver, the FEM including a packaging substrate configured to receive a plurality of components, the FEM further including a power amplification system implemented on the packaging substrate, the power amplification system configured to amplify the input RF signal to generate an output RF signal, the power amplification system including a Class-E push-pull amplifier including a transformer balun, the power amplification system further including a reactance compensation circuit coupled to the transformer balun, the reactance compensation circuit being configured to reduce variation over frequency of a load impedance of the power amplification system. In some embodiments, the wireless device includes an antenna in communication with the FEM, the antenna configured to transmit the output RF signal.

In some embodiments, the reactance compensation circuit of the wireless module includes a capacitor coupled between the transformer balun and an output of the power amplification system.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
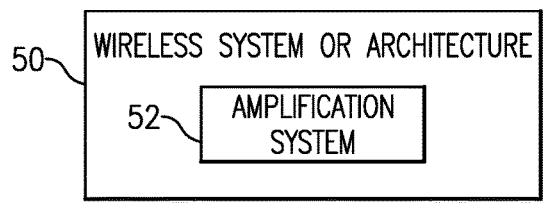
FIG. 1 shows an example wireless system or architecture, according to some implementations.

Introduction:

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
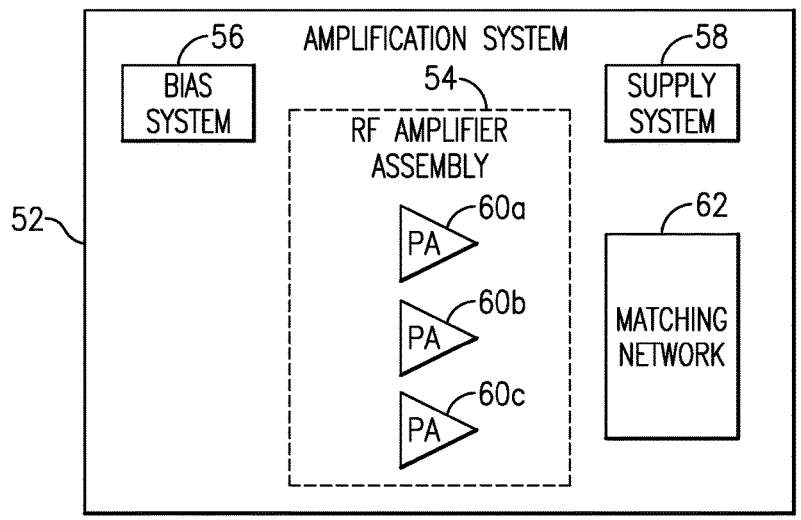
FIG. 2 shows that, in some implementations, an amplification system can include a radio-frequency (RF) amplifier assembly having one or more power amplifiers.

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figures 3A, 3B, 3C:
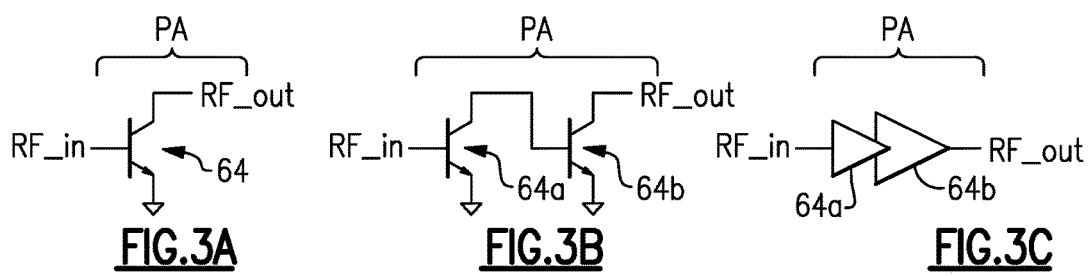
FIGS. 3A-3E show non-limiting examples of power amplifiers, in accordance with some implementations.

For the purpose of description, it will be understood that each PA (60) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figures 3D, 3E:
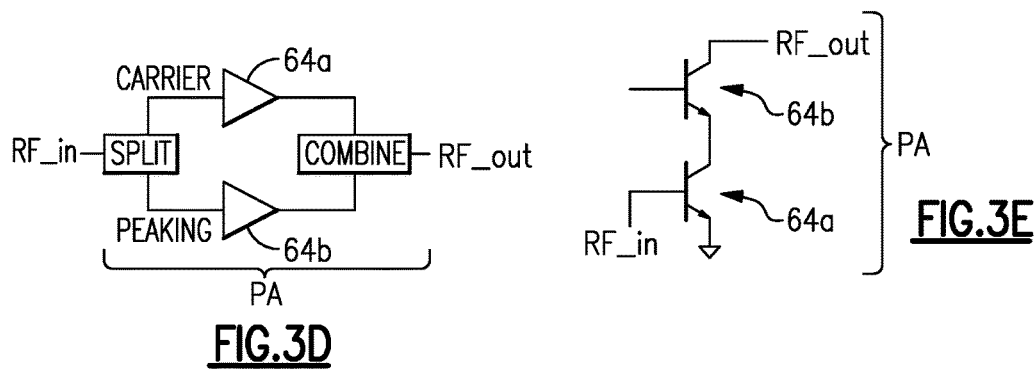

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4:
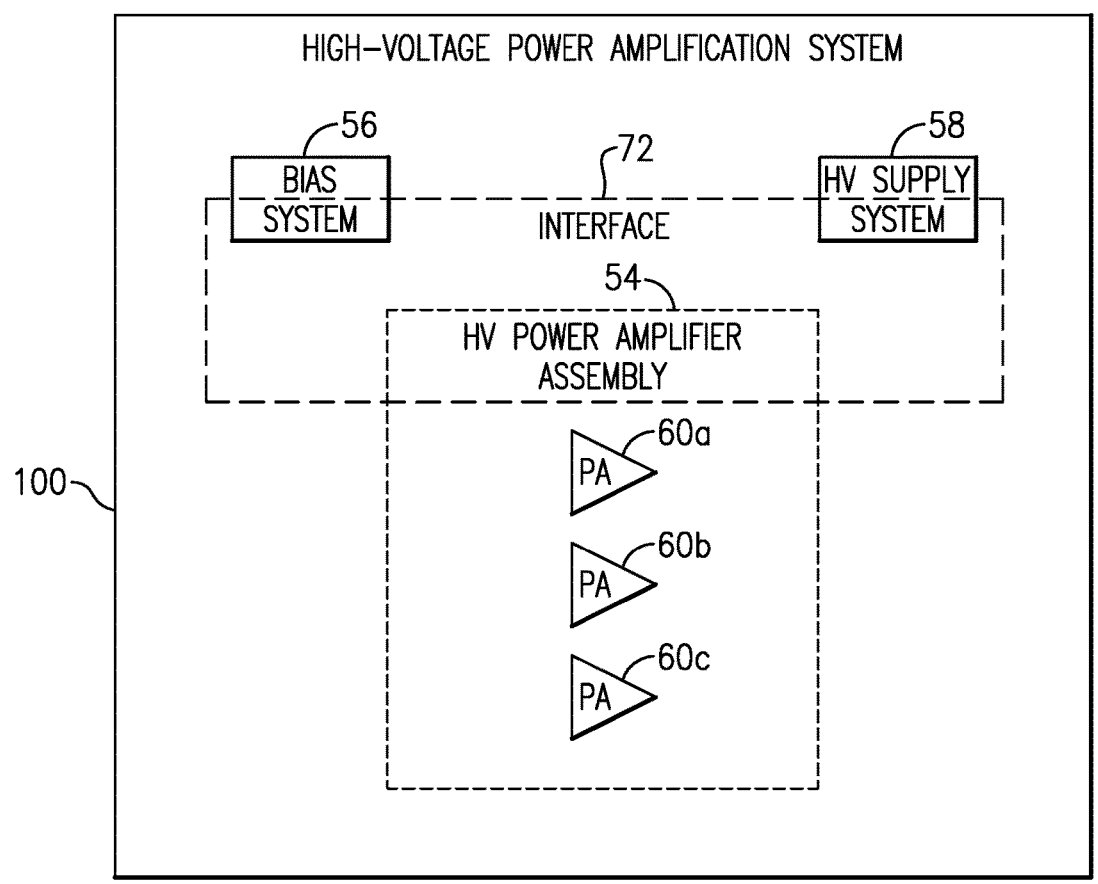
FIG. 4 shows that, in some implementations, an amplification system can be implemented as a high-voltage (HV) power amplification system.

FIG. 4 shows that in some embodiments, the amplification system 52 of FIG. 2 can be implemented as a high-voltage (HV) power amplification system 100. Such a system can include an HV power amplifier assembly 54 configured to include HV amplification operation of some or all of the PAs (e.g., 60a-60c). As described herein, such PAs can be biased by a bias system 56. In some embodiments, the foregoing HV amplification operation can be facilitated by an HV supply system 58. In some embodiments, an interface system 72 can be implemented to provide interface functionalities between the HV power amplifier assembly 54 and either or both of the bias system 56 and the HV supply system 58.

For the purpose of description, it will be understood that high-voltage (HV) can include voltage values that are higher than a battery voltage utilized in portable wireless devices. For example, an HV can be greater than 3.7V or 4.2V. In some situations, an HV can include voltage values that are greater than a battery voltage and at which portable wireless devices can operate more efficiently. In some situations, an HV can include voltage values that are greater than a battery voltage and less than a breakdown voltage associated with a given type of PA. In the example context of GaAs HBT, such a breakdown voltage can be in a range of 15V to 25V. Accordingly, an HV for GaAs HBT PA can be in a range of, for example, 3.7V to 25V, 4.2V to 20V, 5V to 15V, 6V to 14V, 7V to 13V, or 8V to 12V.

Examples Related to Class-E Push-Pull Amplifiers:

Disclosed are examples related to use of a Class-E push-pull amplifier including a transformer balun. The transformer balun can provide harmonic terminations useful in Class-E operation while providing a very low matching loss. Further, the leakage inductance of the transformer can be used to compliment a reactance compensation circuit that flattens the frequency response of the load reactance, thereby achieving outstanding bandwidth.

In particular, power amplification systems described herein can include such features as 25% fractional bandwidth, low power supply rail capacitance, high peak efficiency, improved rejection of second harmonic, and an integrated solution for amplification of both 2G and 3G signals.

Figure 5:
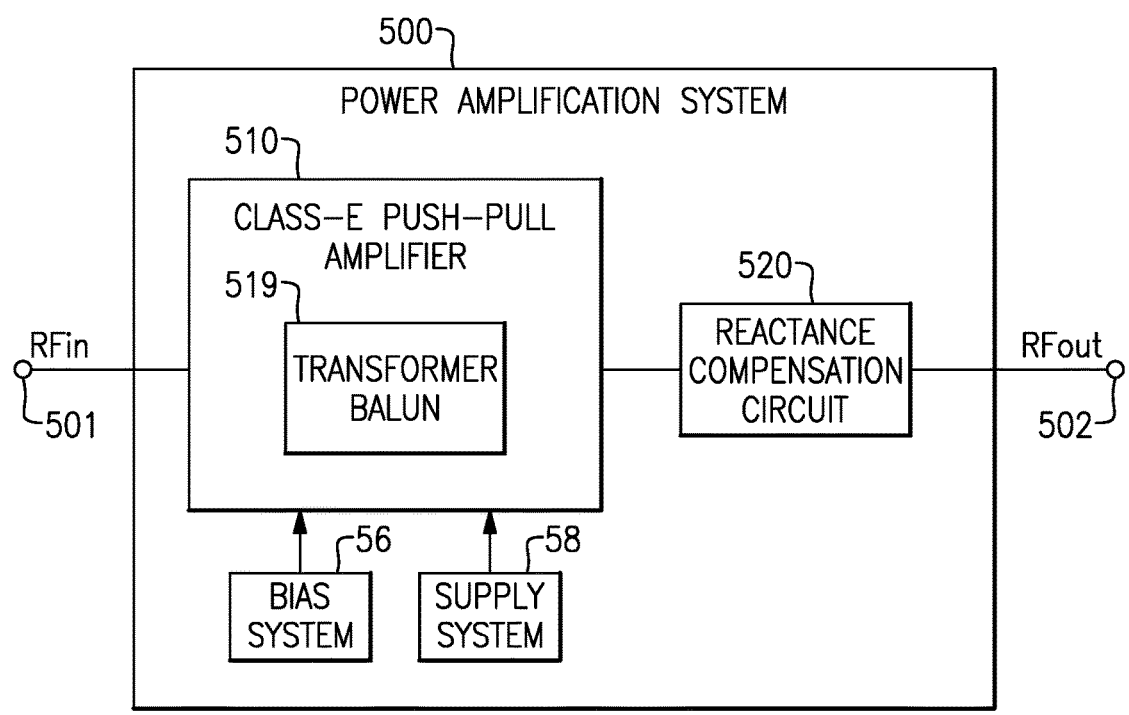
FIG. 5 shows that in some implementations, a power amplification system can include a Class-E push-pull amplifier and a reactance compensation circuit.

FIG. 5 shows that in some embodiments, a power amplification system 500 can include a Class-E push-pull amplifier 510 and a reactance compensation circuit 520. The power amplification system 500 is configured to amplify an input radio-frequency (RF) signal (RFin) received at an input node 501 to generate an output RF signal (RFout) at an output node 502. To that end, the power amplification system 500 includes a Class-E push-pull amplifier 510 including a transformer balun 519 and a reactance compensation circuit 520 coupled to the transformer balun 519. The reactance compensation circuit 520 is configured to reduce variation over frequency of a number of metrics of the power amplification system 500. For example, in various implementations, the reactance compensation circuit 520 reduces variation over frequency of a fundamental load impedance of the power amplification system 500. Consequently, the reactance compensation circuit 520 reduces variation over frequency of the power-added efficiency (PAE) and/or the saturated output power (Psat) of the power amplification system 500.

Like the amplification system 52 of FIG. 1, the power amplification system 500 of FIG. 5 includes a bias system 56 configured to provide a bias voltage to one or more transistors of the power amplification system 500 and a supply system 58 configured to provide a supply voltage to the Class-E push-pull amplifier 510. In some implementations, the Class-E push-pull amplifier 510 is a high-voltage power amplifier.

Figure 6:
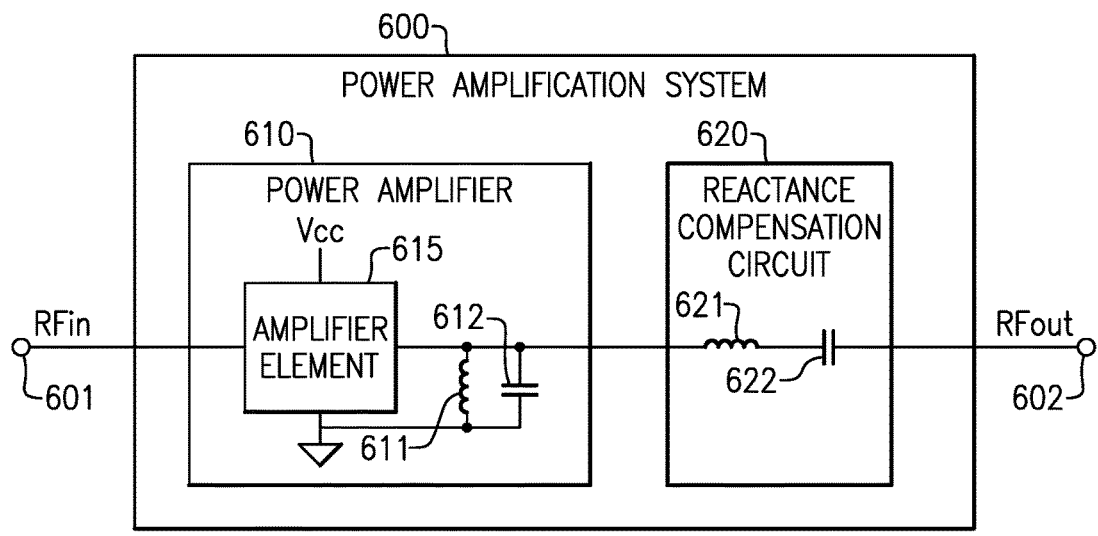
FIG. 6 shows that, in some implementations, a reactance compensation circuit can include an inductor and capacitor connected in series.

FIG. 6 shows that, in some embodiments, a reactance compensation circuit 620 can include an inductor 621 and capacitor 622 connected in series. The power amplification system 600 is configured to amplify an input RF signal (RFin) received at an input node 601 to generate an output RF signal (RFout) at an output node 602. To that end, the power amplification system 600 includes a power amplifier 610 and a reactance compensation circuit 620 coupled to the power amplifier 610.

The power amplifier 610 can be any of the power amplifiers described above with respect to FIGS. 3A-3E, a Class-E push-pull amplifier, or any other type of power amplifier. In some implementations, the power amplifier 610 is a high-voltage power amplifier. The power amplifier 610 includes an amplifier element 615 configured to amplify the RF signal. The amplifier element 615 can include, for example, one or more transistors. The amplifier element 615 can be powered by a supply voltage (Vcc) and include a connection to a ground voltage.

The power amplifier 610 includes a shunt LC circuit including an inductor 611 and a capacitor 612, each coupled between the output of the amplifier element 615 and the ground voltage. The reactance compensation circuit 620 includes a series LC circuit including an inductor 621 and a capacitor 622 connected in series between the output of the amplifier element 615 and the output node 602.

Figure 7:
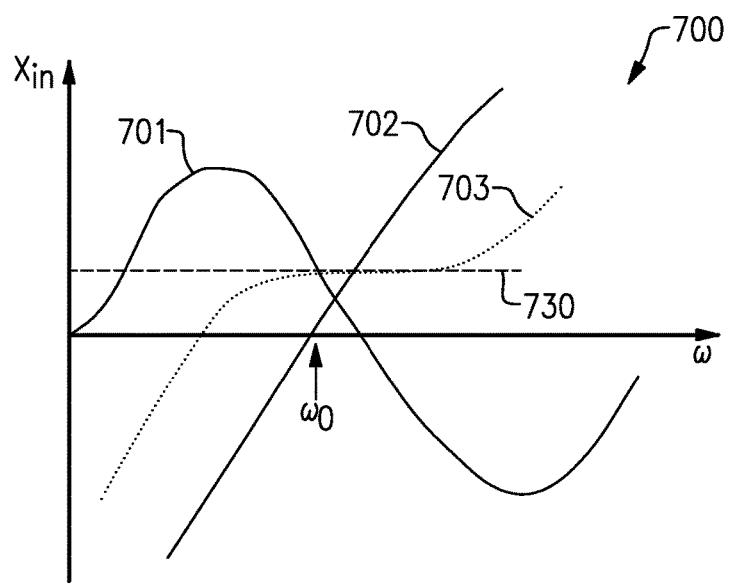
FIG. 7 shows a graphical representation of the reactance (Xin) as a function of frequency (ω) for the power amplification system of FIG. 6.

FIG. 7 shows the reactance (Xin) as a function of frequency ($\omega$) for the power amplification system 600 of FIG. 6. The reactance of the shunt LC circuit of the power amplifier 610, including the inductor 611 and the capacitor 612, varies as a function of frequency as shown by curve 701. The reactance of the series LC circuit of the reactance compensation circuit 620, including the inductor 621 and the capacitor 622 and tuned to the resonant frequency, varies as a function of frequency as shown by curve 702.

Near the resonant frequency, the reactance of the shunt LC circuit shown by curve 701 has a positive slope, while the reactance of the series LC circuit shown by curve 702 has a negative slope. This reduces the overall reactance slope of the power amplification system 600, as shown by curve 703. With a proper choice of circuit elements, a constant load angle (shown by curve 730) over a wide frequency bandwidth is established.

Figure 8:
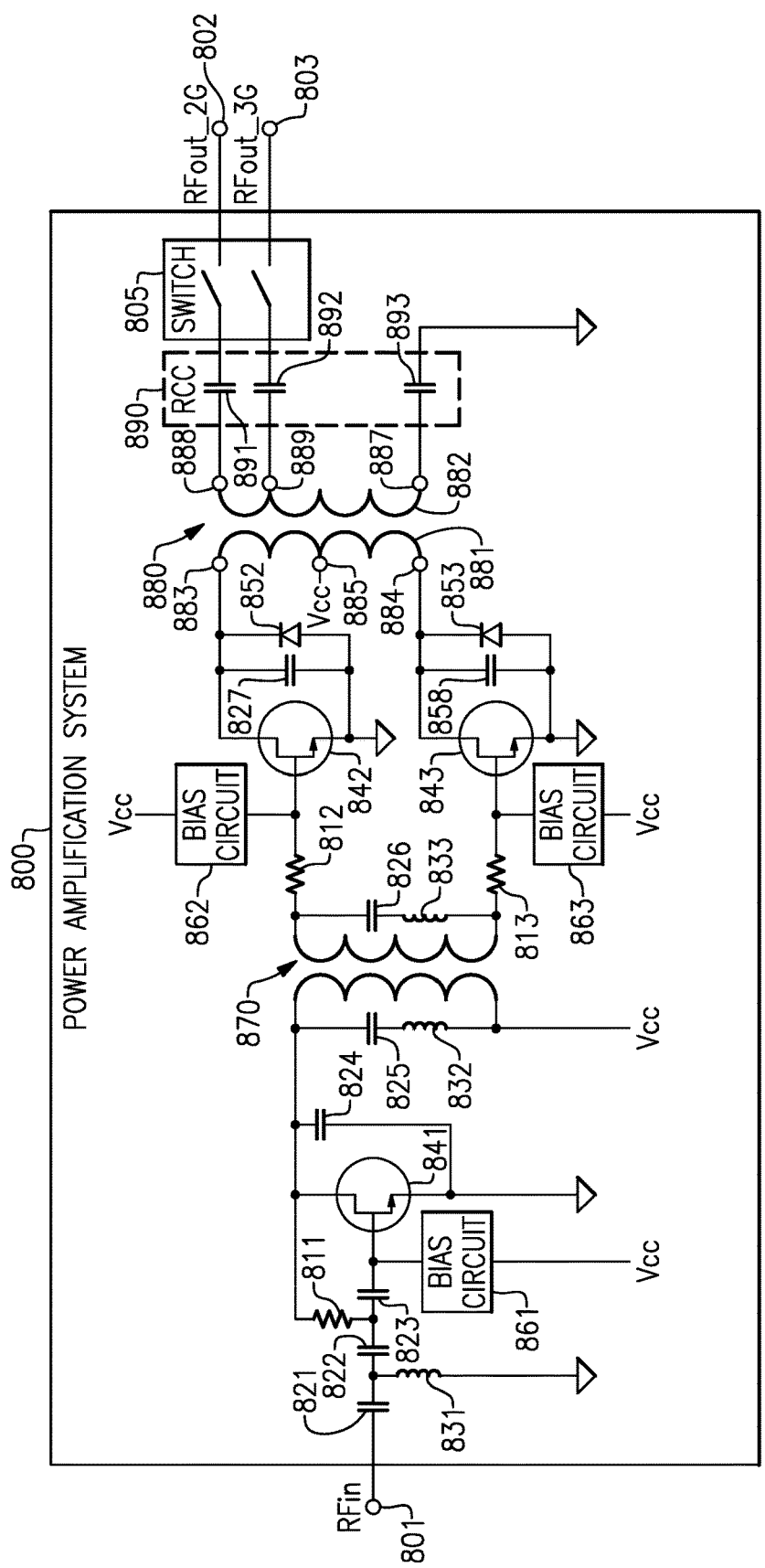
FIG. 8 shows an example of a power amplification system including a Class-E push-pull amplifier including a transformer balun and a reactance compensation circuit, in accordance with some implementations.

FIG. 8 shows an example of a power amplification system 800 including a Class-E push-pull amplifier including a transformer balun 880 and a reactance compensation circuit 890. The power amplification system 800 is configured to amplify an input radio-frequency (RF) signal (RFin) received at an input node 801 to generate either a 2G output RF signal (RFout_2G) at a 2G output node 802 or a 3G output RF signal (RFout_3G) at a 3G output node 803. Similarly, the power amplification system 800 can generate differently powered outputs for multiple power modes in 4G or 5G applications without a significant change to the power supply voltage. The switch 805 includes two single-pole/single-throw (SPST) switches, of which no more than one is closed at any time. For a 2G input RF signal, the first SPST is closed, connecting the 2G output node 802 to the rest of the circuit. For a 3G input RF signal, the second SPST is closed, connecting the 3G output node 803 to the rest of the circuit.

The power amplification system 800 includes a first capacitor 821, a second capacitor 822, and a third capacitor 823 coupled in series between the input node 801 and the gate of a drive transistor 841. The power amplification system 800 includes a drive bias circuit 861 power by a supply voltage (Vcc), coupled to the gate of the drive transistor 841, and configured to bias the drive transistor 841.

The power amplification system includes a first inductor 831 having a first end coupled to a node between the first capacitor 821 and the second capacitor 822 and having a second end coupled to a ground voltage. The power amplification system 800 includes a first resistor 811 having a first end coupled to a node between the second capacitor 822 and the third capacitor 823 and having a second end coupled to a drain of the drive transistor 841. The power amplification system 800 includes a fourth capacitor 824 coupled between the drain of the drive transistor 841 and the source of the drive transistor 841. The source of the drive transistor 841 is coupled to the ground voltage.

The power amplification system 800 includes a transformer divider 870. The transformer divider includes a first coil and a second coil. A first end of the first coil is coupled to the drain of the drive transistor 841 and a second end of the first coil is coupled to the supply voltage. The first end and second end of the second coil are coupled, via respective resistors 812, 813, to respective gates of respective differential transistors 842, 843. The power amplification system 800 includes second-harmonic traps disposed between the ends of the first coil and second coil of the transformer divider 870, each including a capacitor 825, 826 and an inductor 832, 833 connected in series.

The power amplification system 800 includes two differential bias circuits 862, 863 powered by the supply voltage, respectively coupled to the respective gates of the differential transistors 842, 843, and respectively configured to bias the differential transistors 842, 843.

The power amplification system 800 includes two capacitors 827, 828 respectively coupled between the respective sources and drains of the differential transistors 842, 843 and includes two diodes 852, 853 respectively coupled between the respective sources and drains of the differential transistors 842, 843.

The power amplification system 800 includes a transformer balun 880. The transformer balun 880 includes a first coil 881 (e.g., a primary coil) and a second coil 882 (e.g., a secondary coil). The transformer balun 880 includes a first tap 883 at a first end of the first coil 881 and a second tap 884 at a second end of the first coil 881. The transformer balun 880 includes a third tap 885 at point along the first coil 881 (e.g., approximately a middle of the first coil 881). The transformer balun 880 includes a fourth tap 887 at a first end of the second coil 882 and a fifth tap 888 at a second end of the second coil 882. The transformer balun 880 includes a sixth tap 889 at a point along the second coil 882.

The first tap 883 and second tap 884 of the transformer balun 880 are respectively coupled to the drains of the differential transistors 842, 843. The third tap 885 of the transformer balun 880 is coupled to the supply voltage. The fourth tap 887 of the transformer balun 880 is coupled, via the reactance compensation circuit 890, to the ground voltage. The fifth tap 888 and sixth tap 889 of the transformer balun 880 are coupled, via the reactance compensation circuit 890 and a switch 805, to the 2G output node 802 and the 3G output node 803, respectively.

The reactance compensation circuit 890 includes a first reactance compensation capacitor 891 coupled between the fifth tap 888 and the 2G output node 802 (via the switch 805), a second reactance compensation capacitor 892 coupled between the sixth tap 889 and the 3G output node 803 (via the switch), and a third capacitor 893 coupled between the fourth tap 887 and the ground voltage.

The transformer balun 880 can be characterized by a magnetic inductance (Lm), a turn ratio (T), and a coupling coefficient (k). In various implementations, the magnetic inductance is selected such that it satisfies a reactance requirement of the Class-E push-pull amplifier. For example, the magnetic inductance can be approximately four times the supply voltage (Vcc) squared, divided by a desired output power (Pout), and divided by an output frequency (ω). As an equation:

$$L_m = \frac{4 \times V_{cc}^2}{P_{out} \times \omega}$$

In various implementations, the turn ratio (also referred to as a transformation ration) is selected such that is satisfies a load impedance of the Class-E push-pull amplifier. For example, the turn ratio can be approximately the square root of the following: the load impedance ($Z_0$) times the desired output power, divided by 2.73, divided by the supply voltage squared. As an equation:

$$T = \sqrt{\frac{Z_0 \times P_{out}}{2.73 \times V_{cc}^2}}$$

In various implementations, the coupling coefficient is selected such that the leakage inductance of the second coil satisfies the reactance compensation requirement. Thus, in some implementations, the transformer balun 880 has a coupling coefficient selected to reduce variation over frequency of the fundamental load impedance of the power amplification system 800. For example, the coupling coefficient can be approximately one minus the following: the load impedance times 1.026 divided by the output frequency, divided by the turn ratio squared, divided by the magnetizing inductance. As an equation:

$$k = 1 - \frac{Z_0 \times 1.026}{\omega \times T^2 \times L_m}$$

Substituting the equations above for the turn ratio and magnetic inductance yields a constant coupling coefficient of approximately −0.4.

In various implementations, the capacitance of the reactance compensation capacitors of the reactance compensation circuit 890 are selected such that the DC blocking capacitance of the power amplification system 800 is reduced to satisfy the reactance compensation requirement. For example, the DC blocking capacitance (Cblock) can be approximately 1.95 divided by the output frequency, divided by the load impedance. As an equation:

$$C_{block} = \frac{1.95}{\omega \times Z_0}$$

The DC blocking capacitance can be reduced by the reactance compensation capacitors of the reactance compensation circuit 890. In some implementations, the DC blocking capacitance is reduced by two capacitors (e.g., the first reactance compensation capacitor 891 and third reactance compensation capacitor 893) between the ground and the output node (e.g., the 2G output node 802). In other implementations, the DC blocking capacitance is reduced by a single capacitor between the transformer balun 880 and the output node.

Thus, the leakage inductance of the transformer balun 880 in series with a capacitance of the reactance compensation circuit 890 (e.g., one or more of the reactance compensation capacitors 891-893) forms a series resonant circuit have a reactance that increases with frequency. In contrast, the Class-E push-pull amplifier has a reactance that decreases with frequency. Thus, the reactance compensation circuit includes a DC blocking capacitance selected to reduce variation over frequency of the fundamental load impedance.

Figure 9:
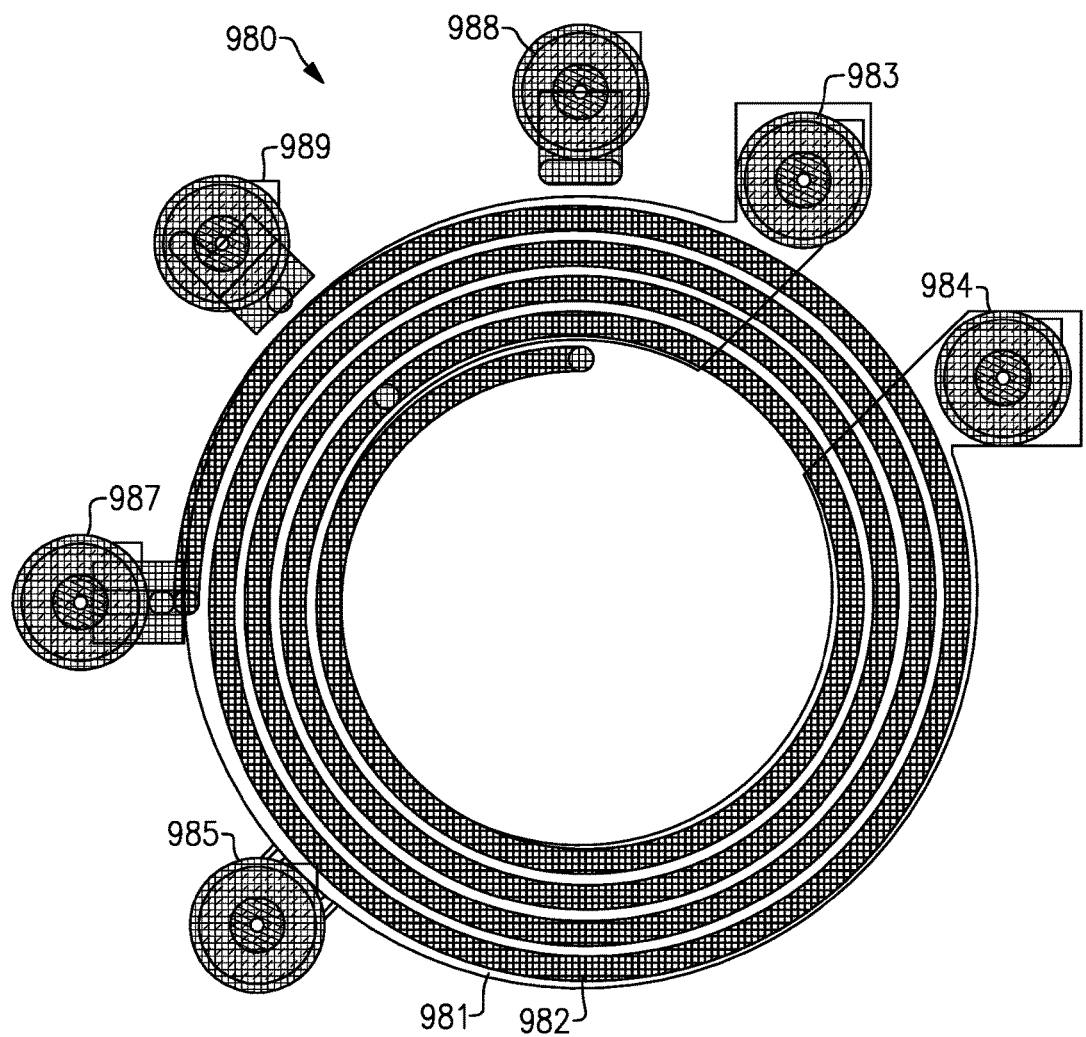
FIG. 9 shows an example of an IPD (integrated passive device) balun that can used as the transformer balun in the power amplification system of FIG. 8, in accordance with some implementations.

FIG. 9 shows an example of an IPD (integrated passive device) balun 980 that can used as the transformer balun 880 in the power amplification system 800 of FIG. 8. The IPD balun 980 includes a first coil 981 and a second coil 982. The second coil 982 is disposed substantially parallel to and disposed apart from the first coil 981.

The first coil 981 extends from a first tap 983 to a second tap 984. The IPD balun 980 includes a third tap 985 at the center of the first coil 981. The second coil 982 extends from a fourth tap 987 to a fifth tap 988. The IPD balun 980 includes a sixth tap 989 at a point along the second coil 981 approximately ¾ of the length of the second coil 981 from fourth tap 987.

Figure 10:
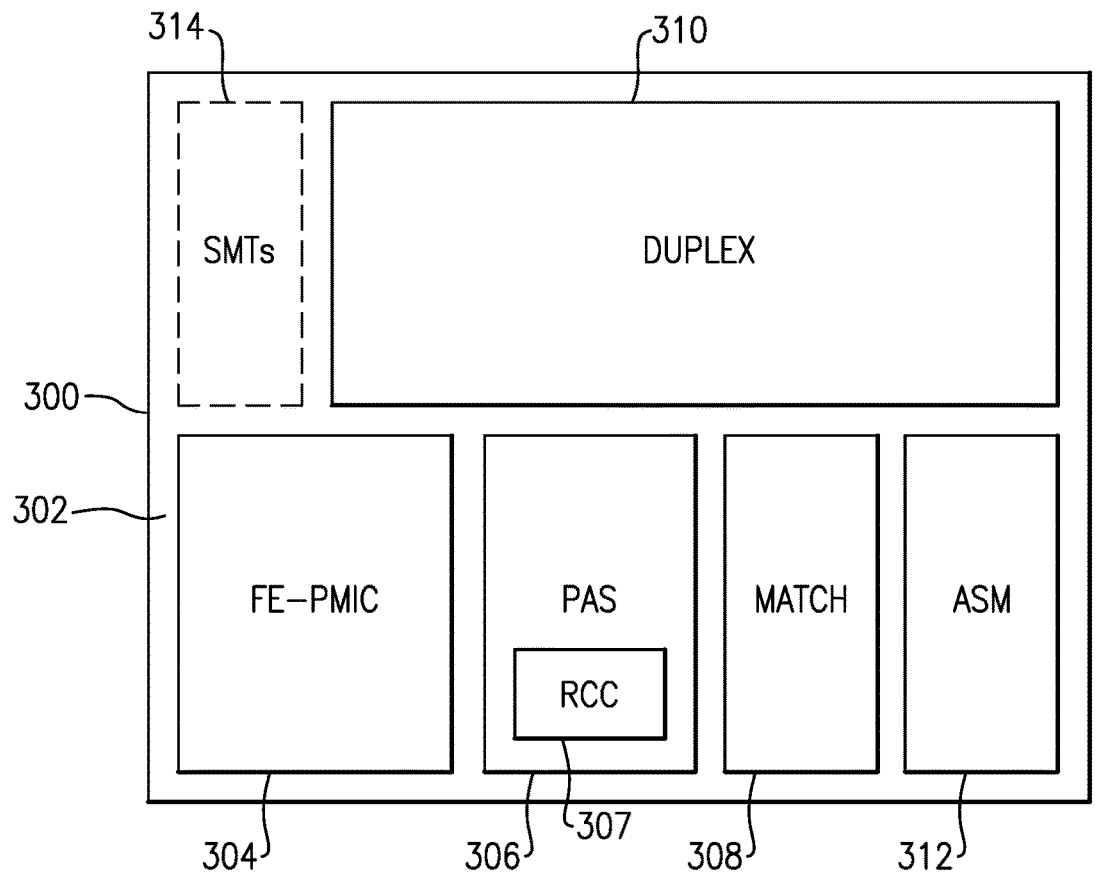
FIG. 10 depicts a module having one or more features as described herein.

FIG. 10 shows that in some embodiments, some or all of power amplification systems (e.g., those shown in FIGS. 5, 6, and 8) can be implemented, wholly or partially, in a module. Such a module can be, for example, a front-end module (FEM). In the example of FIG. 10, a module 300 can include a packaging substrate 302, and a number of components can be mounted on such a packaging substrate. For example, an FE-PMIC (Front-end Power Management Integrated Circuit) component 304, a power amplifier assembly 306, a match component 308, and a duplexer assembly 310 can be mounted and/or implemented on and/or within the packaging substrate 302. The power amplifier assembly 306 may include a reactance compensation circuit 307 such as those described above with respect to FIGS. 5, 6, and 8. The power amplifier assembly 306 may include a Class-E push-pull amplifier including a transformer-based balun. Other components such as a number of SMT (surface-mount technology) devices 314 and an antenna switch module (ASM) 312 can also be mounted on the packaging substrate 302. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 11:
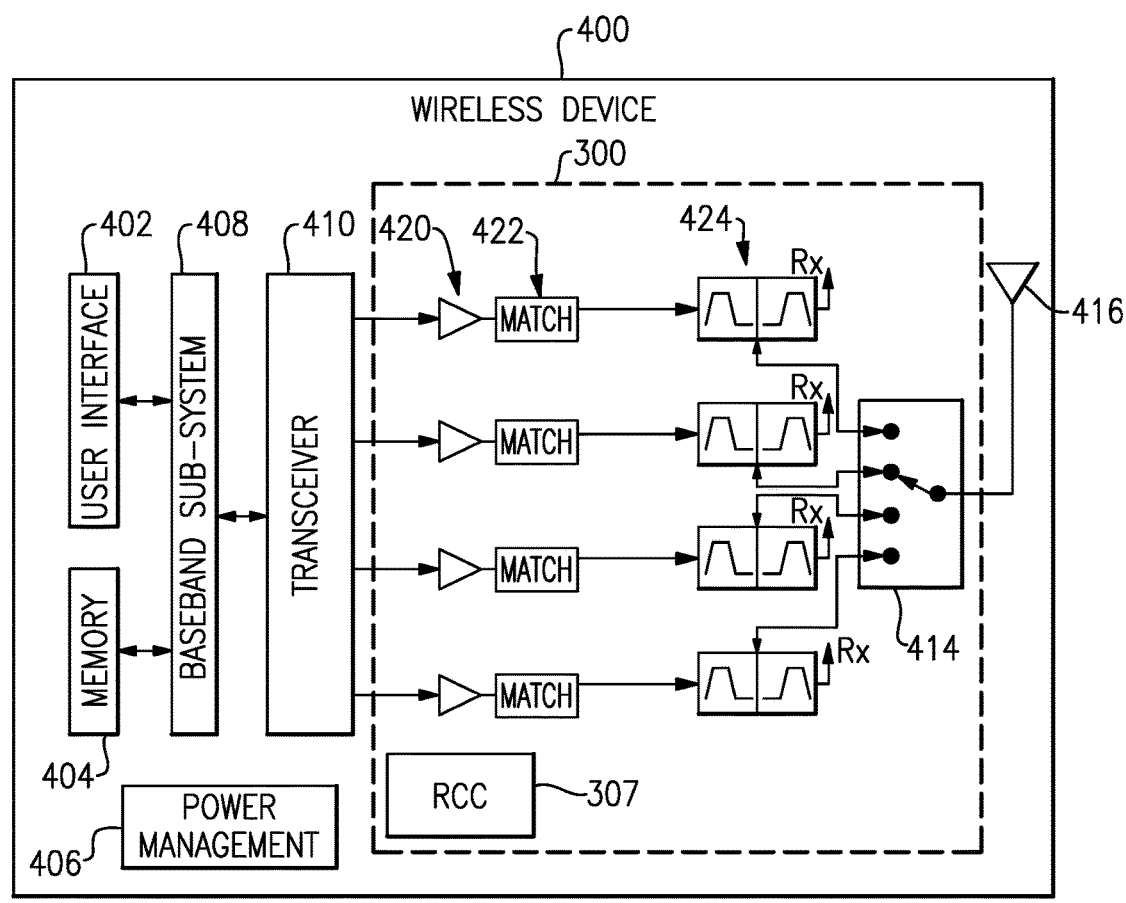
FIG. 11 depicts a wireless device having one or more features described herein.

FIG. 11 depicts an example wireless device 400 having one or more advantageous features described herein. In the context of a module having one or more features as described herein, such a module can be generally depicted by a dashed box 300, and can be implemented as, for example, a front-end module (FEM).

Referring to FIG. 11, power amplifiers (PAs) 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 424. Such amplified and filtered signals can be routed to an antenna 416 through an antenna switch 414 for transmission. In some embodiments, the duplexers 424 can allow transmit and receive operations to be performed simultaneously using a common antenna (e.g., 416). In FIG. 16, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

As described herein, one or more features of the present disclosure can provide a number of advantages when implemented in systems such as those involving the wireless device of FIG. 11. For example, the disclosed architecture may greatly improve the usable bandwidth of a Class-E push-pull amplifier. Further, the inclusion of two output taps on the transformer balun allows integration of 2G and 3G amplifiers.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
   a Class-E push-pull amplifier including a transformer balun; and
   a reactance compensation circuit coupled to the transformer balun, the reactance compensation circuit being configured to reduce variation over frequency of a fundamental load impedance of the power amplification system, and the reactance compensation circuit including a first capacitor coupled between the transformer balun and an output of the power amplification system and a second capacitor coupled between the transformer balun and a ground voltage.

2. The power amplification system of claim 1 wherein a leakage inductance of the transformer balun in series with a capacitance of the reactance compensation circuit forms a series resonant circuit having a reactance that increases with frequency.

3. The power amplification system of claim 1 wherein the reactance compensation circuit includes a DC blocking capacitance selected to reduce variation over frequency of the fundamental load impedance.

4. The power amplification system of claim 1 wherein the transformer balun has a coupling coefficient selected to reduce variation over frequency of the fundamental load impedance.

5. The power amplification system of claim 4 wherein the coupling coefficient is approximately −0.4.

6. The power amplification system of claim 1 wherein the transformer balun includes a first coil and a second coil, the first coil having a first tap coupled to a first differential path of the Class-E push-pull amplifier, a second tap coupled to a second differential path of the Class-E push-pull amplifier, and a third tap coupled to a supply voltage, the second coil having a fourth tap coupled, via the reactance compensation circuit, to a first output of the power amplification system and a fifth tap coupled, via the reactance compensation circuit, to a ground voltage.

7. The power amplification system of claim 6 wherein the second coil further has a sixth tap coupled, via the reactance compensation circuit, to a second output of the reactance compensation circuit.

8. The power amplification system of claim 7 wherein the first output is a 2G output and the second output is a 3G output.

9. The power amplification system of claim 7 further comprising a switch configured to couple either of the first output or the second output to the reactance compensation circuit.

10. The power amplification system of claim 1 wherein the Class-E push-pull amplifier includes a driver transistor coupled between an input of the power amplification system and a divider, a first differential transistor disposed between a first output of the divider and the transformer balun, and a second differential transistor disposed between a second output of the divider and the transformer balun.

11. The power amplification system of claim 10 further comprising one or more bias circuits configured to bias at least one of the driver transistor, the first differential transistor, or the second differential transistor.

12. The power amplification system of claim 10 wherein the divider includes a transformer.

13. The power amplification system of claim 12 further comprising a second-harmonic trap disposed between a first end and a second end of a first coil of the transformer.

14. A radio-frequency module comprising:
    a packaging substrate configured to receive a plurality of components; and
    a power amplification system implemented on the packaging substrate, the power amplification system including a Class-E push-pull amplifier including a transformer balun, the power amplification system further including a reactance compensation circuit coupled to the transformer balun, the reactance compensation circuit being configured to reduce variation over frequency of a load impedance of the power amplification system, and the reactance compensation circuit including a first capacitor coupled between the transformer balun and an output of the power amplification system and a second capacitor coupled between the transformer balun and a ground voltage.

15. The radio-frequency module of claim 14 wherein the radio-frequency module is a front-end module.

16. The radio-frequency module of claim 14 wherein a leakage inductance of the transformer balun in series with a capacitance of the reactance compensation circuit forms a series resonant circuit having a reactance that increases with frequency.

17. The radio-frequency module of claim 14 wherein the reactance compensation circuit includes a DC blocking capacitance selected to reduce variation over frequency of the fundamental load impedance.

18. A wireless device comprising:
    a transceiver configured to generate an input radio-frequency (RF) signal;
    a front-end module (FEM) in communication with the transceiver, the FEM including a packaging substrate configured to receive a plurality of components, the FEM further including a power amplification system implemented on the packaging substrate, the power amplification system configured to amplify the input RF signal to generate an output RF signal, the power amplification system including a Class-E push-pull amplifier including a transformer balun, the power amplification system further including a reactance compensation circuit coupled to the transformer balun, the reactance compensation circuit being configured to reduce variation over frequency of a load impedance of the power amplification system, and the reactance compensation circuit including a first capacitor coupled between the transformer balun and an output of the power amplification system and a second capacitor coupled between the transformer balun and a ground voltage; and an antenna in communication with the FEM, the antenna configured to transmit the output RF signal.

19. The wireless device of claim 18 wherein a leakage inductance of the transformer balun in series with a capacitance of the reactance compensation circuit forms a series resonant circuit having a reactance that increases with frequency.

20. The wireless device of claim 18 wherein the reactance compensation circuit includes a DC blocking capacitance selected to reduce variation over frequency of the fundamental load impedance.

* * * * *